(12) United States Patent
Niu et al.

(10) Patent No.: US 6,699,624 B2
(45) Date of Patent: Mar. 2, 2004

(54) GRATING TEST PATTERNS AND METHODS FOR OVERLAY METROLOGY

(75) Inventors: Xinhui Niu, San Jose, CA (US); Nickhil Jakatdar, Fremont, CA (US)

(73) Assignee: Timbre Technologies, Inc., Santa Clara, CA (US)

( * ) Notice: Subject to any disclaimer, the term of this patent is extended or adjusted under 35 U.S.C. 154(b) by 54 days.

(21) Appl. No.: 09/794,686

(22) Filed: Feb. 27, 2001

(65) Prior Publication Data

US 2002/0135875 A1 Sep. 26, 2002

(51) Int. Cl.[7] .................................................. G03F 9/00
(52) U.S. Cl. ............................................. 430/5; 430/22
(58) Field of Search ........................... 430/5, 22, 30, 430/322; 356/399, 400, 401

(56) References Cited

U.S. PATENT DOCUMENTS 5,674,650 A * 10/1997 Dirksen et al. ............... 430/22
6,383,888 B1 * 5/2002 Stirton ....................... 438/401

OTHER PUBLICATIONS

Neal T. Sullivan, Semiconductor Pattern Overlay, 15 pages, Digital Equipment Corp., Advanced Semiconductor Development, Hudson, MA 01749–2895.

* cited by examiner

*Primary Examiner*—S. Rosasco
(74) *Attorney, Agent, or Firm*—Morrison & Foerster LLP (57) ABSTRACT

A metrology for determining bias or overlay error in lithographic processes. This metrology includes a set of diffraction test patterns, optical inspection techniques by using spectroscopic ellipsometer or reflectometer and a method of test pattern profile extraction. The invention uses a set of diffraction gratings as the test patterns, and thin film metrology equipment, such as spectroscopic ellipsometer or spectroscopic reflectometer. The profiles of the test patterns in the two successive layers are analyzed. Overlay information is obtained after processing the profile data. In a first aspect of the invention, a line-on-line overlay grating test patterns structure is disclosed in which a second layer mask is placed in the center of a clear line in a first layer mask. In a second aspect of the invention, a line-in-line overlay grating test patterns structure is disclosed in which a second layer mask is placed in the center of a dark line in the first mask.

39 Claims, 13 Drawing Sheets

FIGURE 1

Line - on - Line

Line - in - Line nth Layer Mask

40

FIG. 4A after lithography development

41

← resist

FIG. 4B after etch

42

FIG. 4C (n+1)th Layer Mask

43

FIG. 4D after lithography development

44

← resist

GRATING TEST PATTERNS AND METHODS FOR OVERLAY METROLOGY

BACKGROUND INFORMATION

1. Field of the Invention

The present invention relates generally to precision optical measurement of the two process layers on a semiconductor wafer, and more particularly to a set of diffraction grating test patterns that are used in combination with rigorous diffraction grating analysis.

2. Description of Related Art

Lithography continues to be the key enabler and driver for the semiconductor industry. Metrology equipment and methods for critical dimension (CD) and overlay control are the key elements of the lithography infrastructure. Overlay and CD control over large field sizes will continue to be a major concern for sub-100 nm lithography. Overlay requirements are among the most difficult technical challenges in lithography.

The main contributing factors to overlay error are the stage, the alignment system and the distortion signature. Errors can be broken down into stage motion or wafer alignment errors such as placement and rotation inaccuracies and field errors such as errors on the reticle and errors in camera magnification. These errors are correctable. Pincushion or barrel distortions, third-order field errors, are not correctable. The overlay errors must be routinely characterized for a given exposure tool. Three fundamental components of overlay are the alignment target detection capability, the stage positioning accuracy and precision, and the difference in lens distortion between two tools used to expose overlaying process layers.

Technologies used for overlay measurement include electrical test, scanning electron microscope (SEM), and optical microscope. Coherence probe microscopy (CPM), by adding an interferometer to the microscope, enables phase-based measurements that can pick up subtle differences in the index of refraction and the topography. Optical microscope technology has been the dominant measurement technique.

Overlay targets often are variations of box-in-a-box. The center of each box is calculated independently, and a difference between them is determined. Some metrology tools measure overlay error as a combination of linewidth measurements. To increase contrast, the boxes can be replaced with combinations of bars and frames, which add structure at the target's perimeter by providing two edges instead of one. A shortcoming is that there is no practical standard for overlay. Therefore, a true value for any particular overlay target is not known. Some fabs may periodically look at cross sections or make comparisons to electrical parameters; however, not only is this time consuming, it is regulated to the characterization environment, rather than being accomplished in production.

Alignment target detection became a show-stopper for many exposure tools with the proliferation of CMP levels, where very planarized metal layers present considerable challenges to finding and measuring a target's position.

One conventional solution uses a box-in-box test pattern. The details of this conventional solution is described in a section, for example, entitled "Semiconductor Pattern Overlay" in the Handbook of Critical Dimensions Metrology and Process Control, SPIE, vol. CR52, 1994, pp. 160–188.

The shortcomings of conventional solutions include, asymmetry of patterned line profile, aberrations in the illumination and imaging optics, and individual test pattern image sampling. One further shortcoming is that, for polished layers, the signal-to-noise (S/N) ratio in prior arts can be poor and affected by contrast variations in film thickness.

Accordingly, it is desirable to have a fast and flexible method and system for grating overlay patterns.

SUMMARY OF THE INVENTION

The invention uses a set of diffraction gratings as the test patterns, and thin film metrology equipment, such as a spectroscopic ellipsometer and a spectroscopic reflectometer. The profiles of the test patterns in the two successive layers are analyzed. Overlay information is obtained after processing the profile data. In a first aspect of the invention, a line-on-line overlay grating test pattern structure is disclosed in which a second layer mask is placed in the center of a clear line in a first layer mask. In a second aspect of the invention, a line-in-line overlay grating test pattern structure is disclosed in which a second layer mask is placed in the center of a dark line in the first mask.

Advantageously, the present invention uses a spectroscopic ellipsometer or spectroscopic reflectometer without the necessity of requiring a highly precise focusing optical system. Moreover, the present invention provides overlay information about a test pattern, which contains at least 30 repetitive structures. For example, based on one measurement, the present invention provides an average overlay information over at least 30 samples. Furthermore, the present invention requires a less precise wafer stage, so the metrology equipment is considerably cheaper than the metrology equipment used in prior arts.

Other structures and methods are disclosed in the detailed description below. This summary does not purport to define the invention. The invention is defined by the claims.

DETAILED DESCRIPTION OF THE PREFERRED EMBODIMENT(S)

Figure 1:
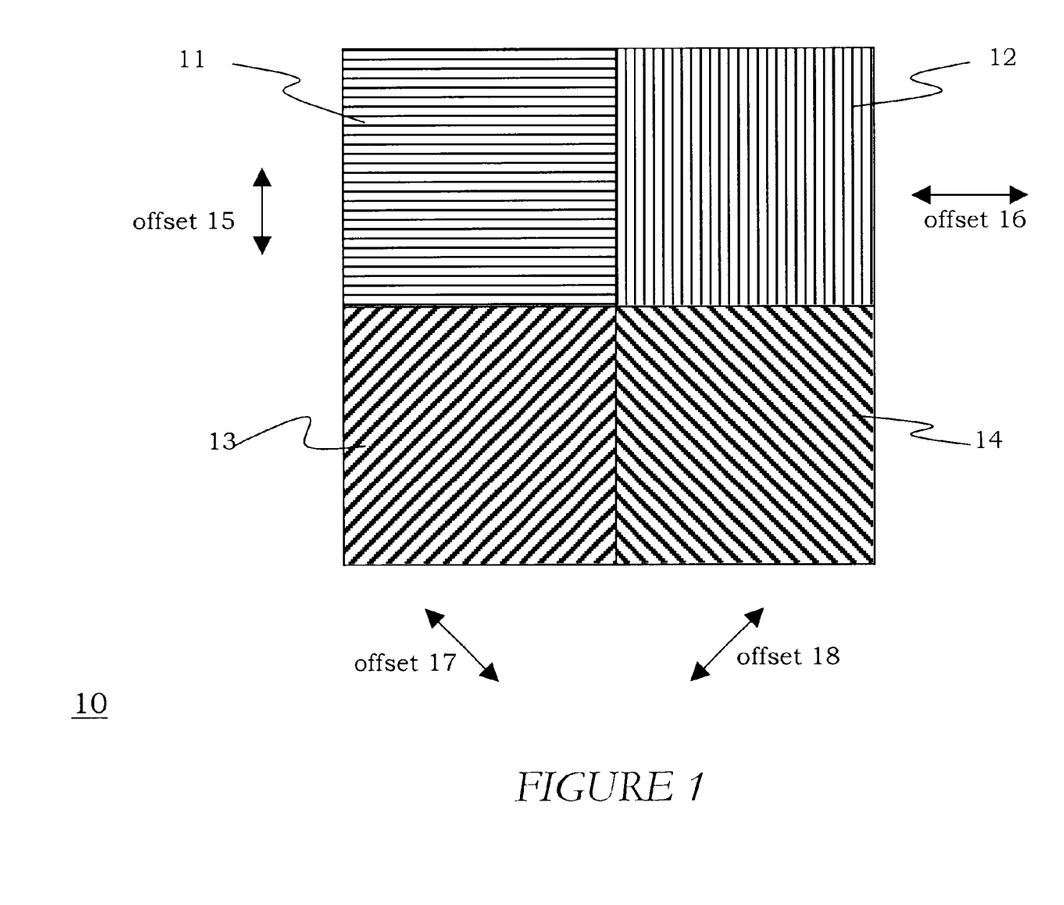
FIG. 1 is a pictorial diagram illustrating quad orientations of overlay patterned grating lines in accordance with the present invention.

FIG. 1 is a pictorial diagram illustrating the quad orientation of overlay patterned gratings 10, with a grating A 11, a grating B 12, a grating C 13, and a grating D 14. The orientation of the patterned grating lines in the present invention is placed at 0, 90, −45, and 45 degrees. The grating A 11 is orthogonal to the grating B 12, and the grating C 13 is orthogonal to the grating D 14.

In the grating A 11, the overlay test pattern lines extend horizontally, with the desirable offset that is detected in an arrow direction 15. In the grating B 12, the overlay test pattern lines extend vertically, with the desirable offset that is detected in an arrow direction 16. In the grating C 13, the overlay test pattern lines extend diagonally with a positive slope, with the desirable offset that is detected in an arrow direction 17. In the grating D 14, the overlay test pattern lines extend diagonally with a negative slope, with the desirable offset that is detected in an arrow direction 18. An orthogonal pair can provide overlay information in any orientation. Furthermore, an orthogonal pair can avoid loading/unloading of a wafer for different overlay orientation requirements.

A mask is a pattern tool, which contains patterns that can be transferred to an entire wafer in one exposure. A mask is said to be a dark-field (or negative) tool, if the field (or background) areas are opaque, and to be a clear-field (or positive) tool if the field is transparent.

Figure 2A:
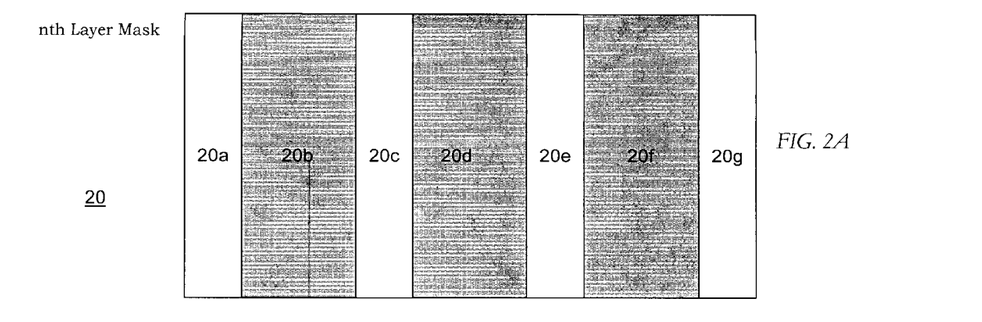
FIGS. 2A–2E are process diagrams illustrating a line-on-line overlay patterned grating in accordance with the present invention.
Figure 2B:
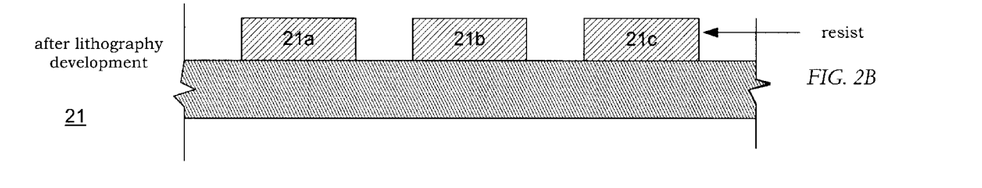
Figure 2C:
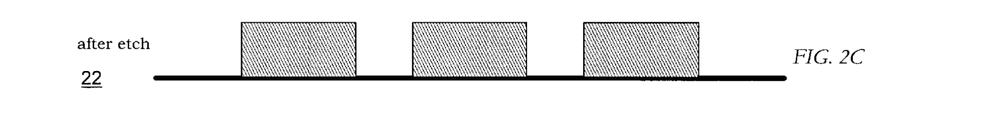
Figure 2D:
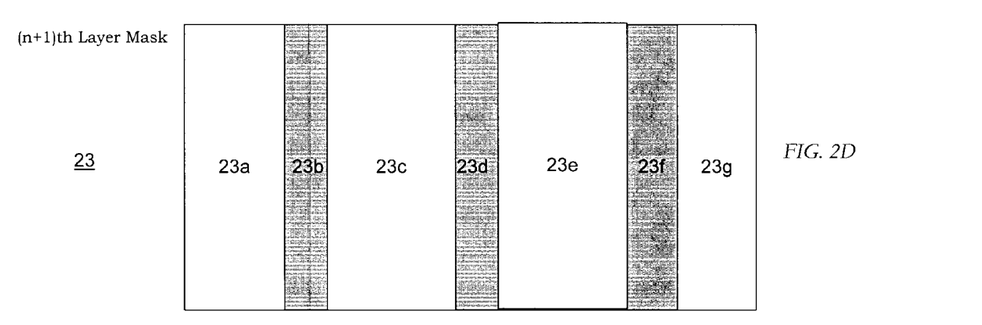
Figure 2E:
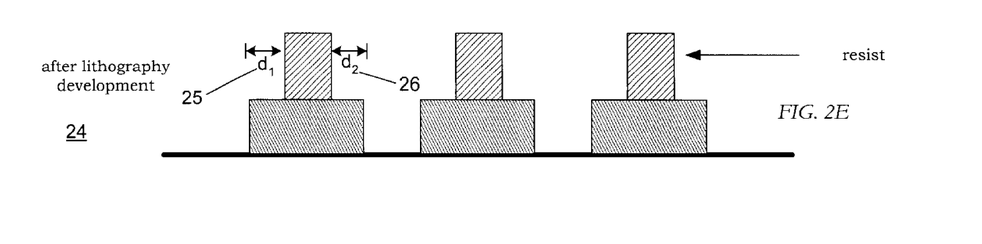

FIGS. 2A–2E are process diagrams illustrating a line-on-line overlay test structure. Here we use positive masks for the illustration. FIG. 2A shows a first layer mask 20, with clear lines 20a, 20c, 20e, and 20g, and dark lines 20b, 20d, and 20f. The dark lines 20b, 20d, and 20f are wider than the clear lines 20a, 20c, 20e, and 20g. FIG. 2B shows how the photoresist is patterned after the lithography development 21. Photoresist 21a, 21b, and 21c are patterned over the first layer mask 20. FIG. 2C shows how the material under the photoresist is patterned after the etch process 22 (note that photoresist is removed). FIG. 2D shows the second layer mask 23, with clear lines 23a, 23c, 23e, and 23g, and dark lines 23b, 23d, and 23f. The clear lines 23a, 23c, 23e, and 23g are wider than the dark lines 23b, 23d, and 23f. FIG. 2E shows how the photoresist is patterned on the previous patterned layer 24. A $d_1$ 25 distance measures a gap from the left edge of the first dark line in the second mask to the left edge of the first dark line in the first mask; and a $d_2$ 26 distance measures a gap from the right edge of the first dark line in the second mask to the right edge of the first dark line in the first mask.

Figure 3A:
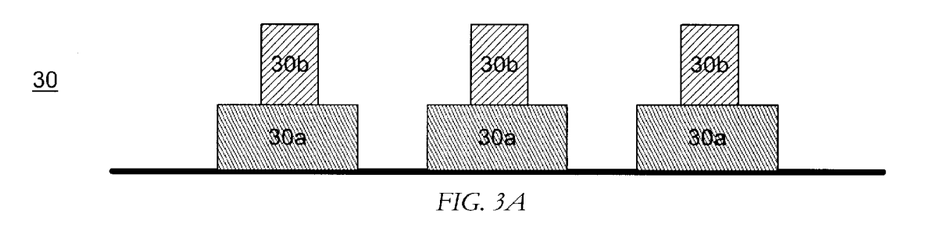
FIGS. 3A–3D are process diagrams illustrating various examples of adding one or more layers in a line-on-line overlay patterned grating in accordance with the present invention.
Figure 3B:
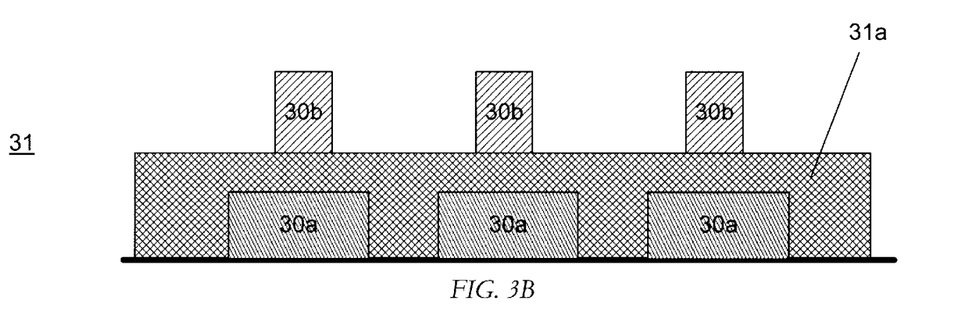
Figure 3C:
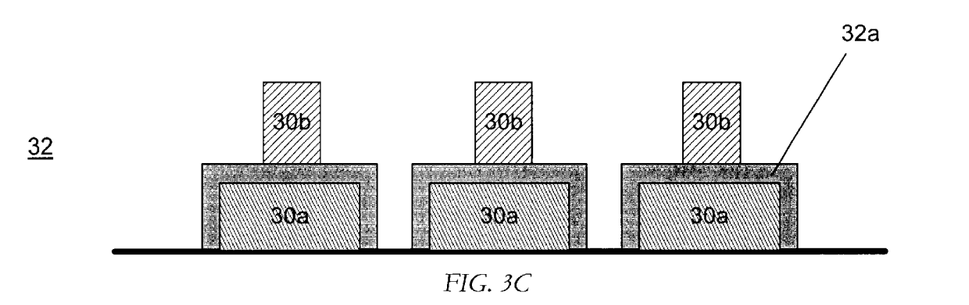
Figure 3D:
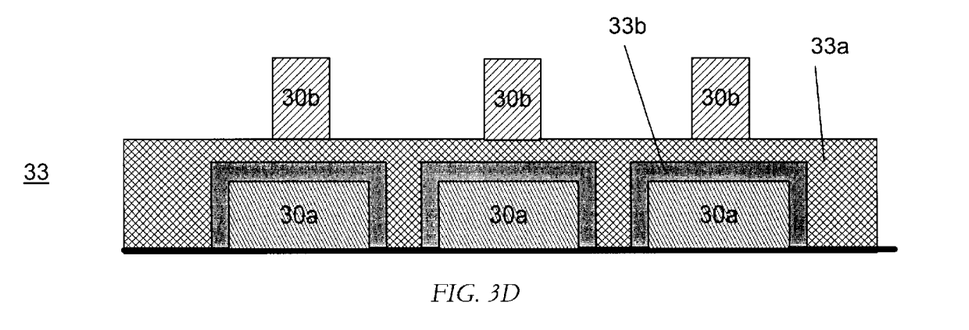

There can be some material layers between the second lithography process and the first etch process. For example, FIGS. 3A–3D are process diagrams of various examples of adding one or more layers in a line-on-line overlay patterned grating. FIG. 3A shows a general structural diagram 30 with a first etch process 30a and a second lithography process 30b. In a first type of structural diagram 31 in FIG. 3B, a material layer 31a is inserted between the first etch process 30a and the second lithography process 30b. In a second type of structural diagram 32 in FIG. 3C, a material layer 32a is placed between the first etch process 30a and the second lithography process 30b. In a third type of structural diagram 33 in FIG. 3D, two material layers 33a and 33b are placed between the first etch process 30a and the second lithography process 30b.

Figure 4A:
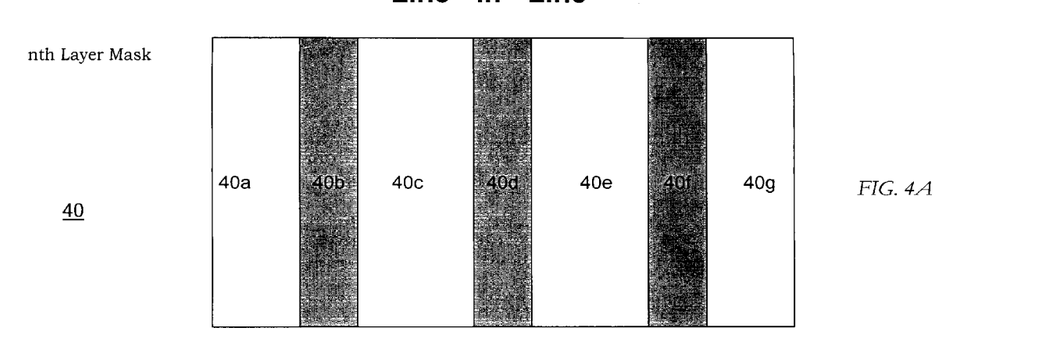
FIGS. 4A–4E are process diagrams illustrating a line-in-line overlay patterned grating in accordance with the present invention.
Figure 4B:
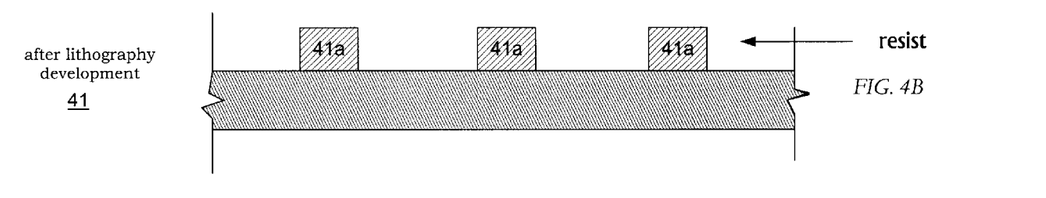
Figure 4C:
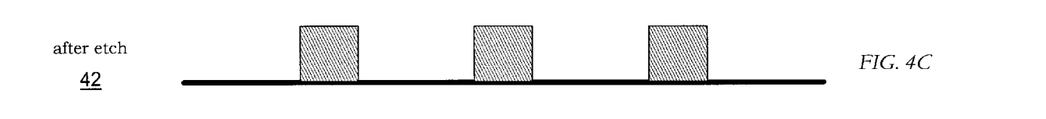
Figure 4D:
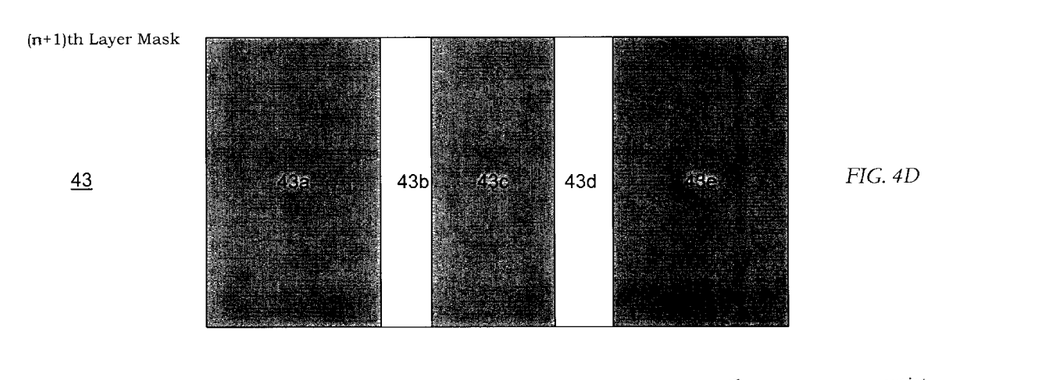
Figure 4E:
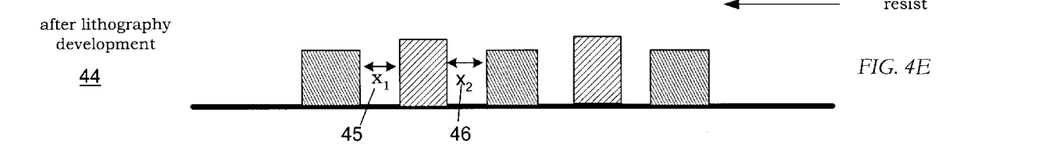

FIGS. 4A–4E are process diagrams illustrating a line-in-line overlay test structure. Here we use positive masks for the illustration. FIG. 4A shows a first layer mask 40, with clear lines 40a, 40c, 40e, and 40g, and dark lines 40b, 40d, and 40f. The dark lines 40b, 40d, and 40f are narrower than the clear lines 40a, 40c, 40e, and 40g. FIG. 4B shows how the photoresist is patterned after the lithography development 41. Photoresist 41a is patterned over the first layer mask 40. FIG. 4C shows how the material under photoresist is patterned after the etch process 42 (note that photoresist is removed). FIG. 4D shows the second layer mask 43, with dark lines 43a, 43c, and 43e, and clear lines 43b and 43d. The dark lines 43a, 43c, and 43e are wider than the clear lines 43b and 43d. FIG. 4E shows how the photoresist is patterned on the previous patterned layer 44. An $X_1$ 45 distance measures a gap from the left edge of the first clear line 43b in the second mask to the left edge of the first clear line 40c in the first mask, and an $X_2$ 46 distance measures a gap from the right edge of the first clear line 43b in the second mask to the right edge of the first clear line 40c in the first mask.

Figure 5A:
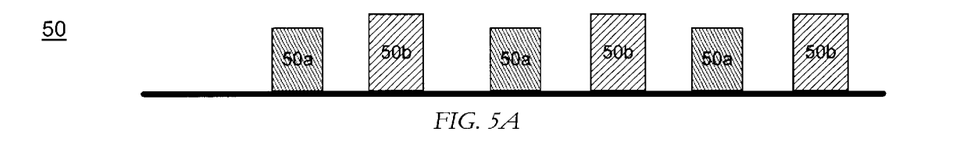
FIGS. 5A–5D are process diagrams illustrating various examples of adding one or more layers in a line-in-line overlay patterned grating in accordance with the present invention.
Figure 5B:
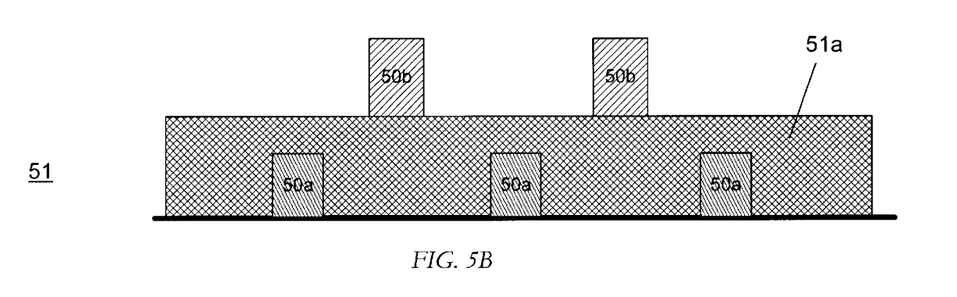
Figure 5C:
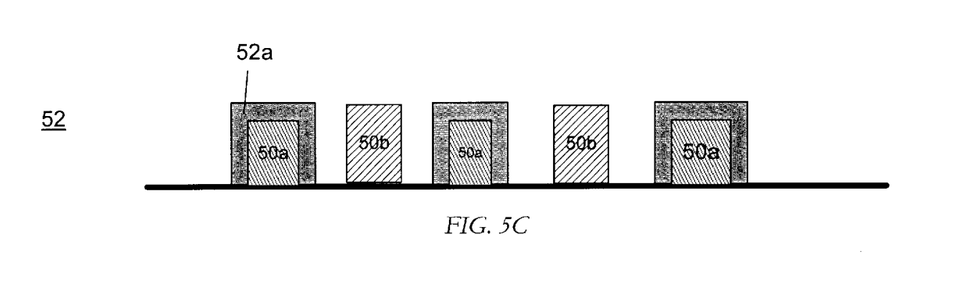
Figure 5D:
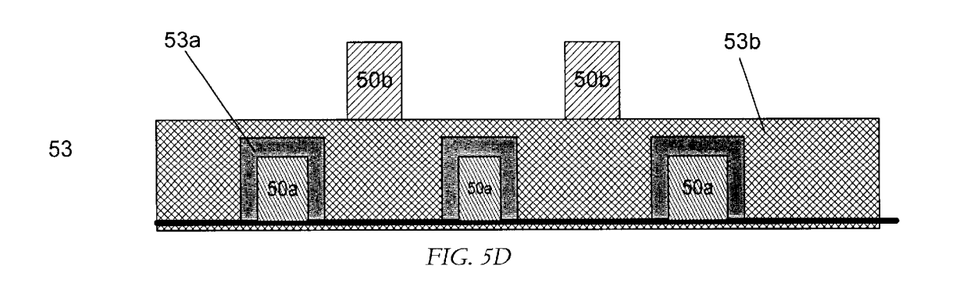

There can be some material layers between the second lithography process and the first etch process. For example, FIGS. 5A–5D are process diagrams of various examples of adding one or more layers in a line-in-line overlay patterned grating. FIG. 5A shows a general structural diagram 50 with a first etch process 50a and a second lithography process 50b. In a first type of structural diagram 51 in FIG. 5B, a material layer 51a is inserted between the first etch process 50a and the second lithography process 50b. In a second type of structural diagram 52 in FIG. 5C, a material layer 52a is placed between the first etch process 50a and the second lithography process 50b. In a third type of structural diagram 53 in FIG. 5D, two material layers 53a and 53b are placed between the first etch process 50a and the second lithography process 50b.

The advantages provided by the orientation of patterned grating lines 10 are as follows. First, for spectroscopic reflectometry, there is no need to change the wafer. Overlay results obtained at different orientation angle can help to reduce random error. Secondly, for spectroscopic ellipsometry, the information from −45 and +45 degrees provides the complete minimum requirement for an overlay metrology purpose, without the requirement of reloading the wafer. Furthermore, the information from 0 or 90 degrees provides the most accurate overlay data.

At each orientation, the present invention has two test patterns, which are called "line-in-line" and "line-on-line" test patterns. The theoretical studies are shown in the following sections.

Complete 2- and 3-dimensional periodic profiles can be measured using phase and/or intensity information from optical techniques such as spectroscopic ellipsometry and reflectometry, as described in a co-pending patent application entitled "Optical Profilometry for 2-D and 3-D Sub-Micron Periodic Features With Three or More Material in the Periodic Layers," assigned to the same assignee, and accorded an application No. 60/474,051 which is incorporated herein by reference in its entirety.

Figure 6:
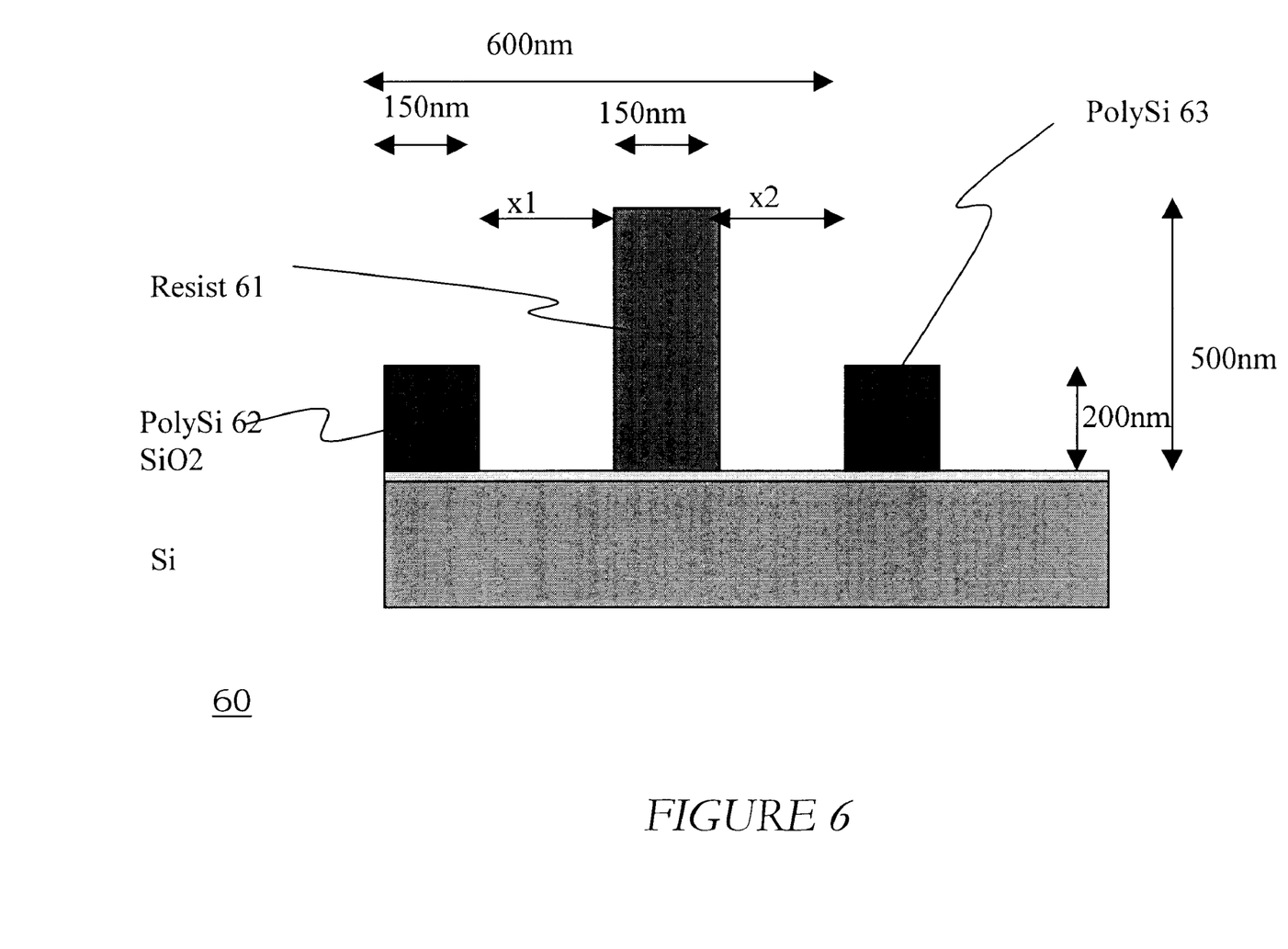
FIG. 6 is a process diagram illustrating a first example of a line-in-line structure in accordance with the present invention.
Figure 7A:
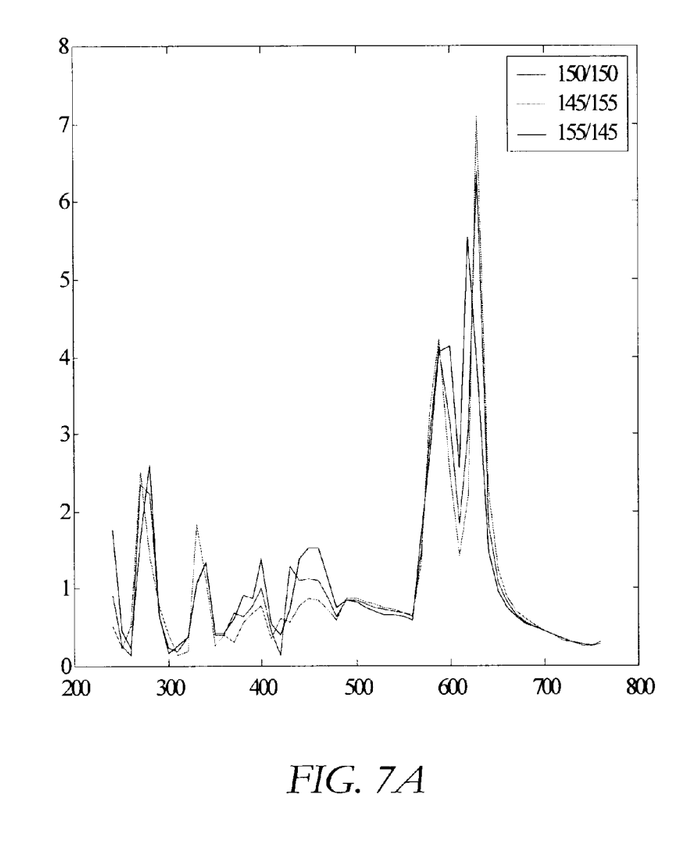
FIGS. 7A–7B are graphical diagrams illustrating the overlay measurements of the line-in-line structure in FIG. 6 using an ellipsometer in accordance with the present invention.
Figure 7B:
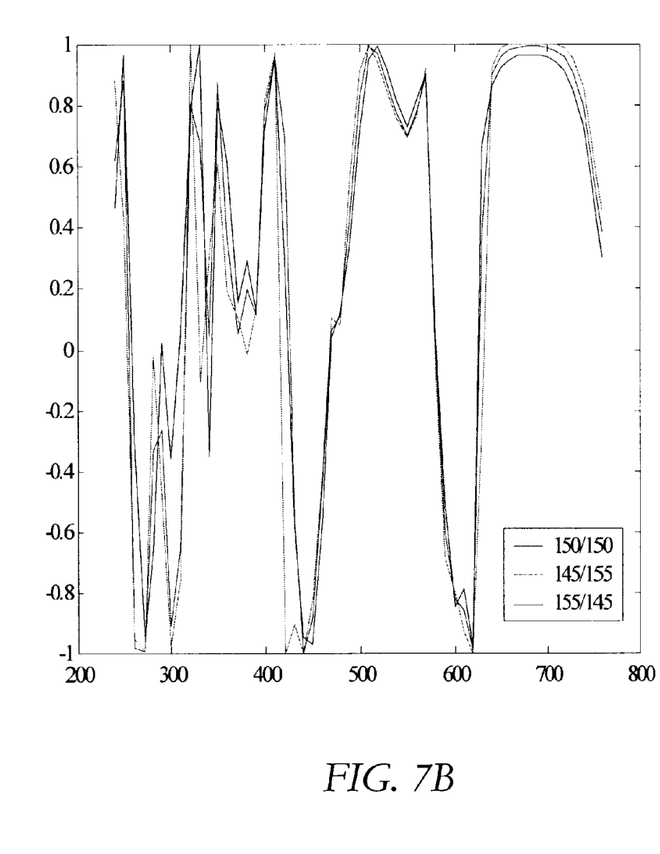

Simulations are performed to support the concepts described above. In all of the examples, it is shown that a 10 nm overlay error can be detected with the presented invention. FIG. 6 is a process diagram illustrating a first example of a line-in-line structure 60. A resist 61 is placed in between a PolySi 62 and a PolySi 63. The pitch is 600 nm from the left edge of the PolySi 62 to the left edge of the PolySi 63. If $x_1=150$, and $x_2=150$, then the resist 61 would be positioned in the center between the PolySi 62 and the PolySi 63. If the resist 61 moves 5 nm to the left, then $x_1=145$, and $x_2=155$. Or, if the resist 61 moves 5 nm to the right, then $x_1=155$, and $x_2=145$. FIGS. 7A–7B are graphical diagrams illustrating the overlay measurements of the line-in-line structure in FIG. 6 using an ellipsometer.

Figure 8:
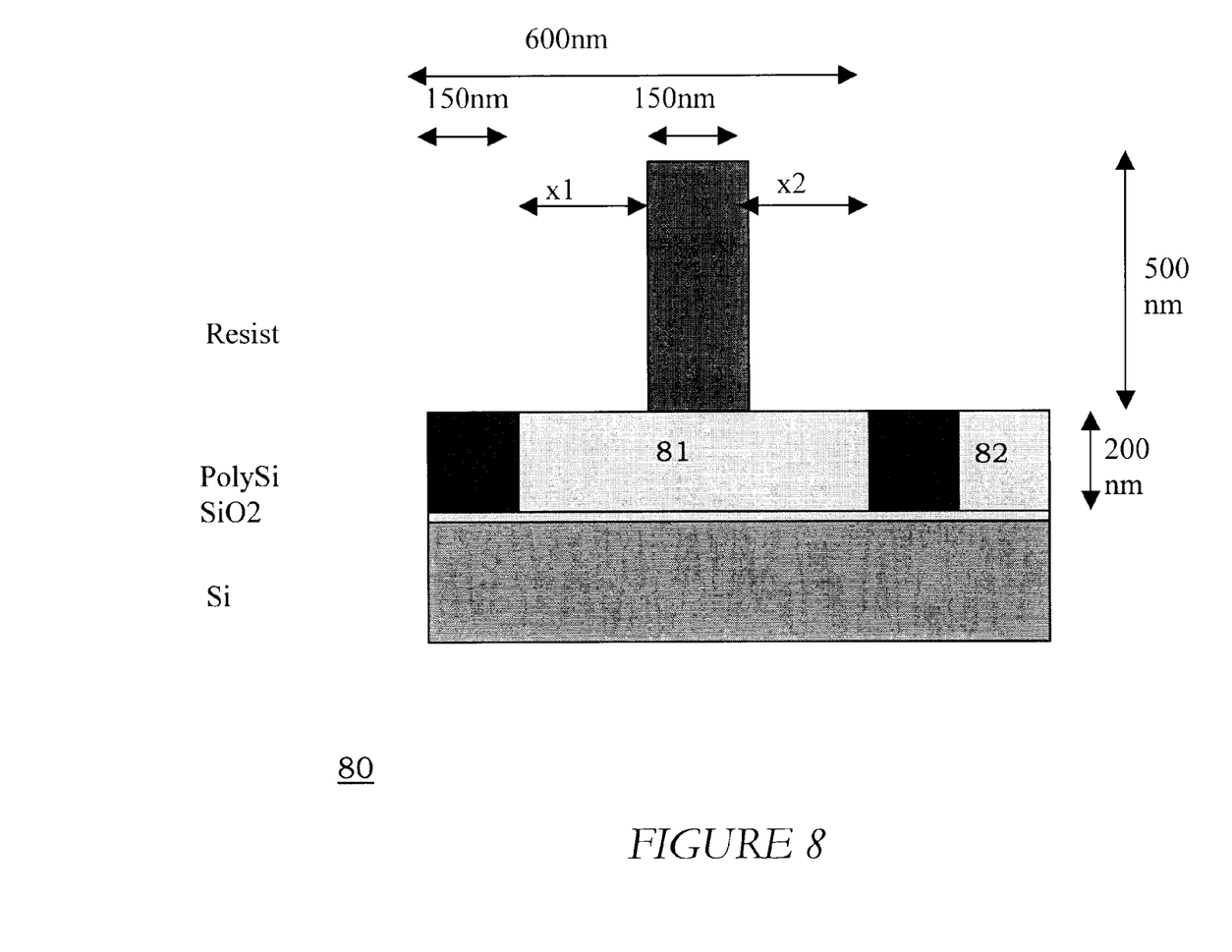
FIG. 8 is a process diagram illustrating a second example of a line-in-line structure in accordance with the present invention.
Figure 9A:
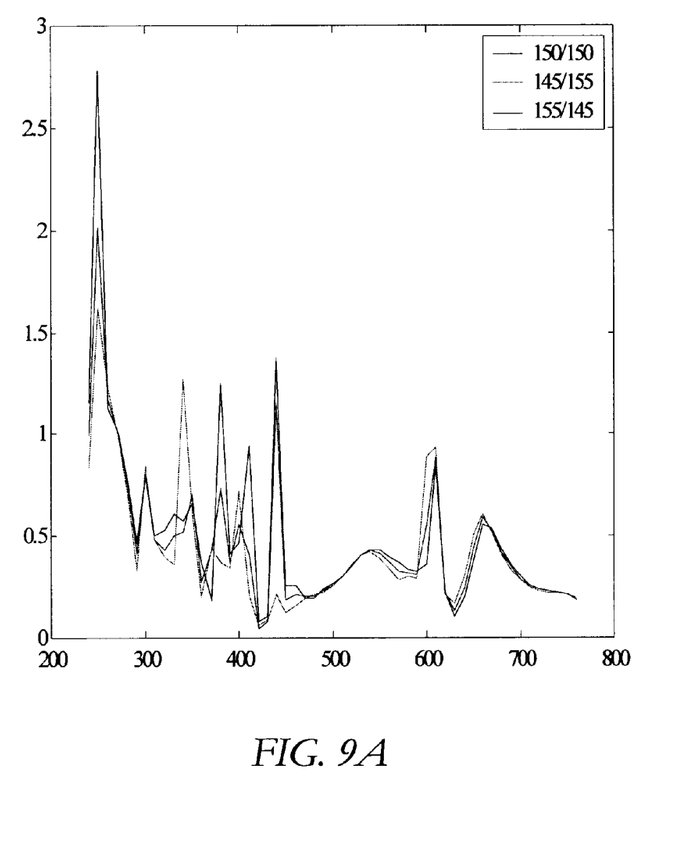
FIGS. 9A–9B are graphical diagrams illustrating the overlay measurement of the line-in-line structure in FIG. 8 using an ellipsometer in accordance with the present invention.
Figure 9B:
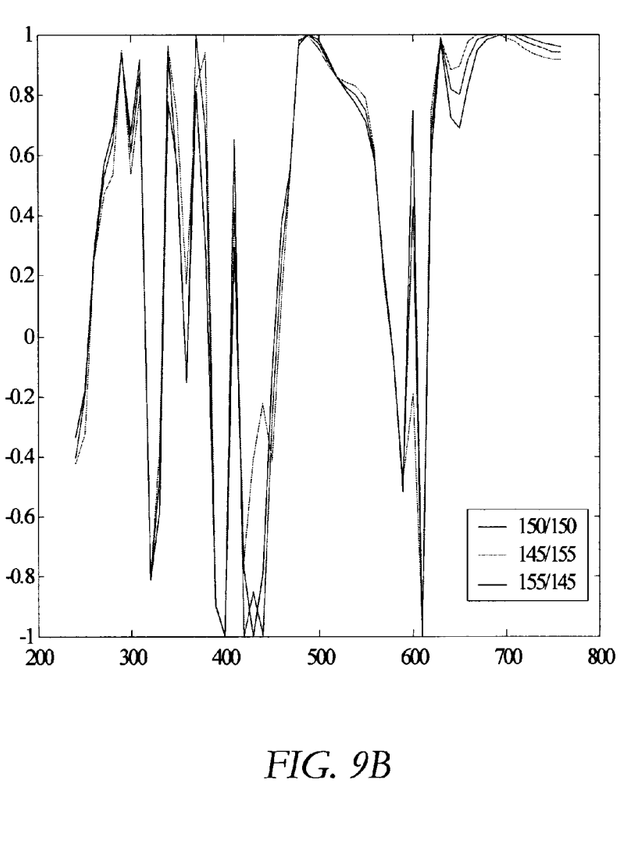

FIG. 8 is a process diagram illustrating a second example of a line-in-line structure 80. In this example, before placing the resist 61, dielectric layers 81 and 82 are deposited between the PolySi 62 and the PolySi 63, followed by CMP (chemical mechanical polishing) planarization. Although the edges for the PolySi 62 and the PolySi 63 are no longer detectable due to the fill-in of dielectric layers 81 and 82, the present invention can still detect the overlay since it does not depend on detection of edges. FIGS. 9A–9B are graphical diagrams illustrating the overlay measurements of the line-in-line structure in FIG. 8 using an ellipsometer.

Figure 10:
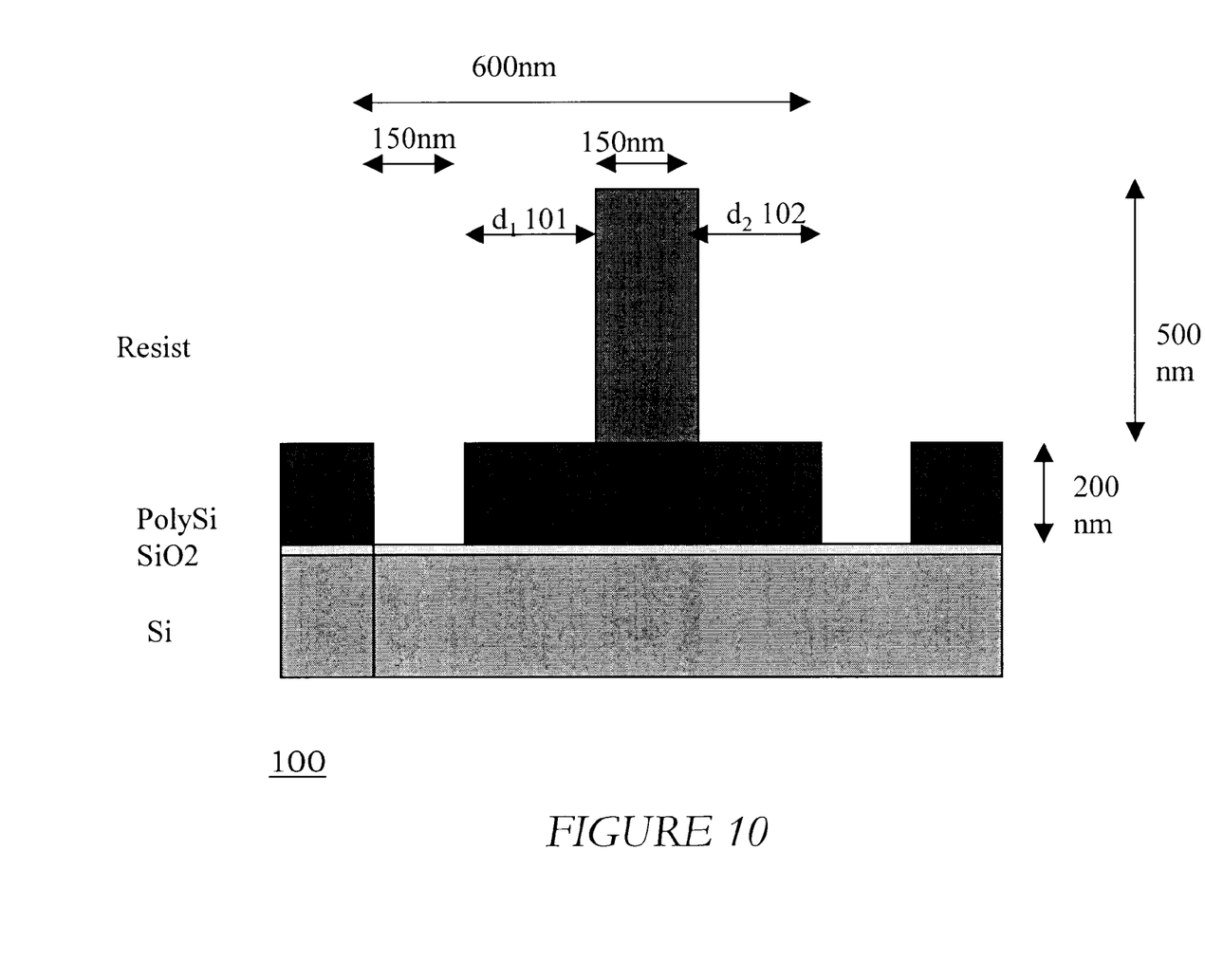
FIG. 10 is a process diagram illustrating a first example of a line-on-line structure in accordance with the present invention.
Figure 11A:
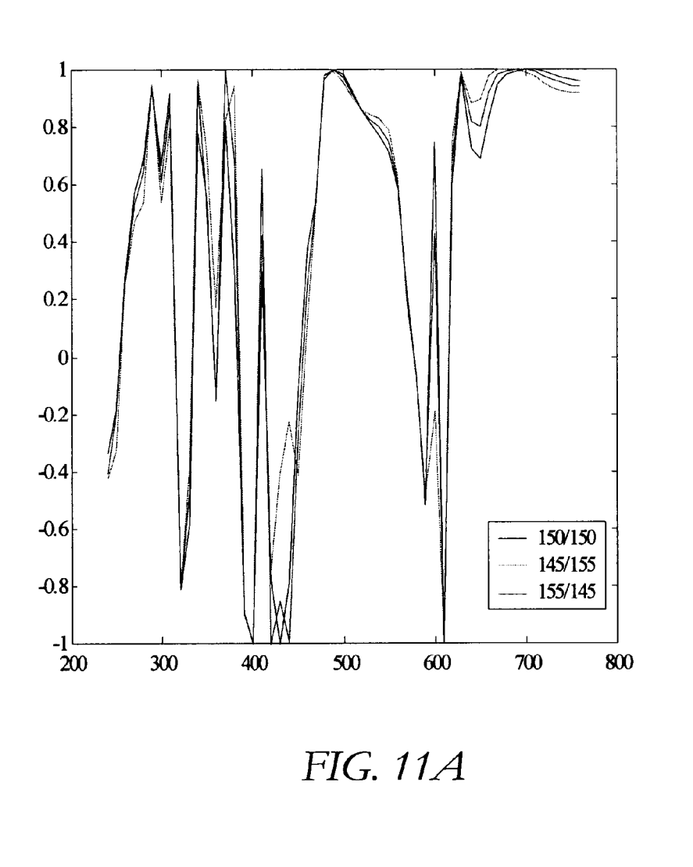
FIGS. 11A–11B are graphical diagrams illustrating the overlay measurements of the line-on-line structure in FIG. 10 using an ellipsometer in accordance with the present invention.
Figure 11B:
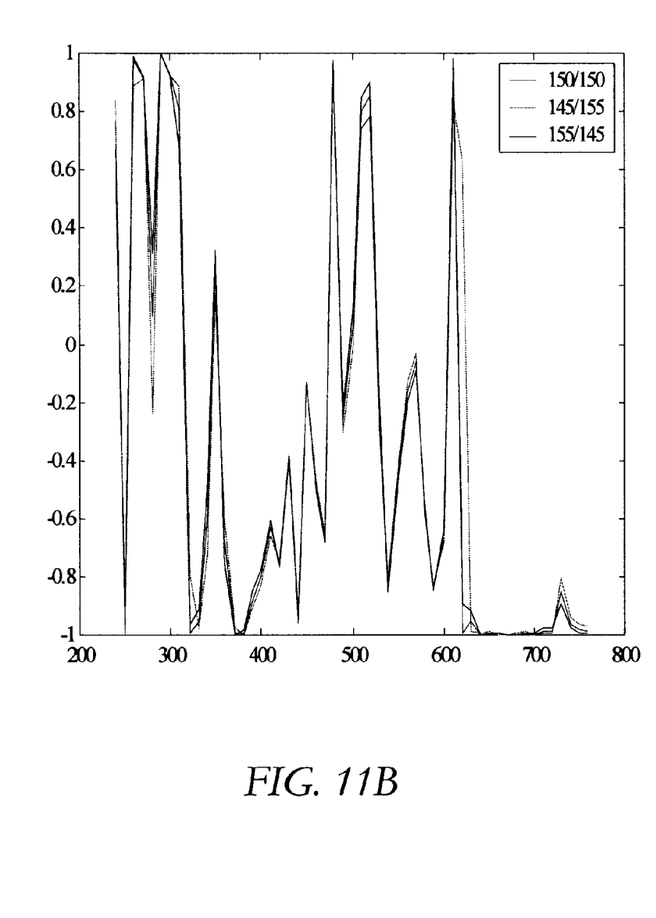

FIG. 10 is a process diagram illustrating a first example of a line-on-line structure 100 with distances $d_1$ 101 and $d_2$ 102. FIGS. 11A–11B are graphical diagrams illustrating the overlay measurements of the line-on-line structure in FIG. 10 using an ellipsometer in accordance with the present invention.

Figure 12:
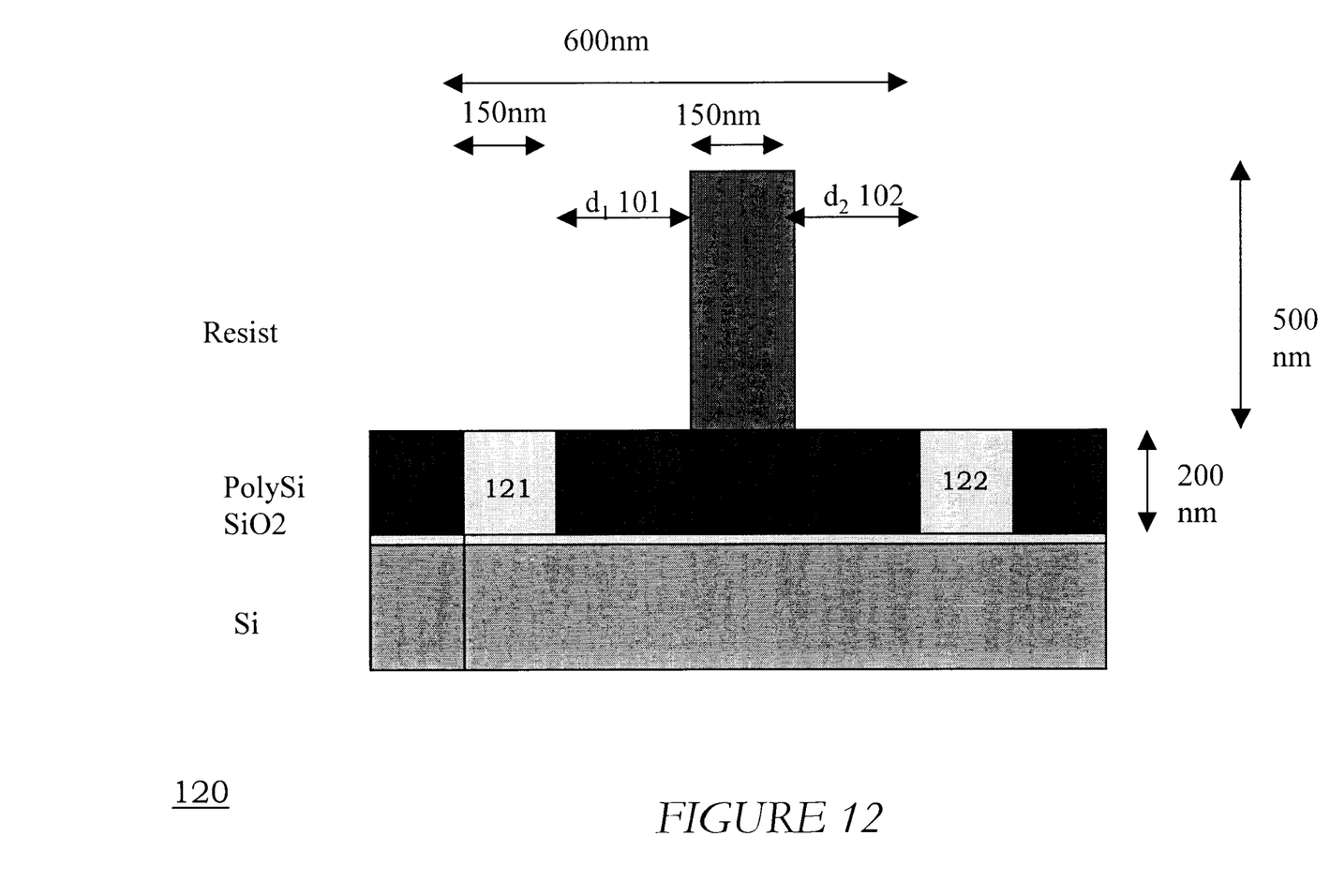
FIG. 12 is a process diagram illustrating a second example of a line-on-line structure in accordance with the present invention.
Figure 13A:
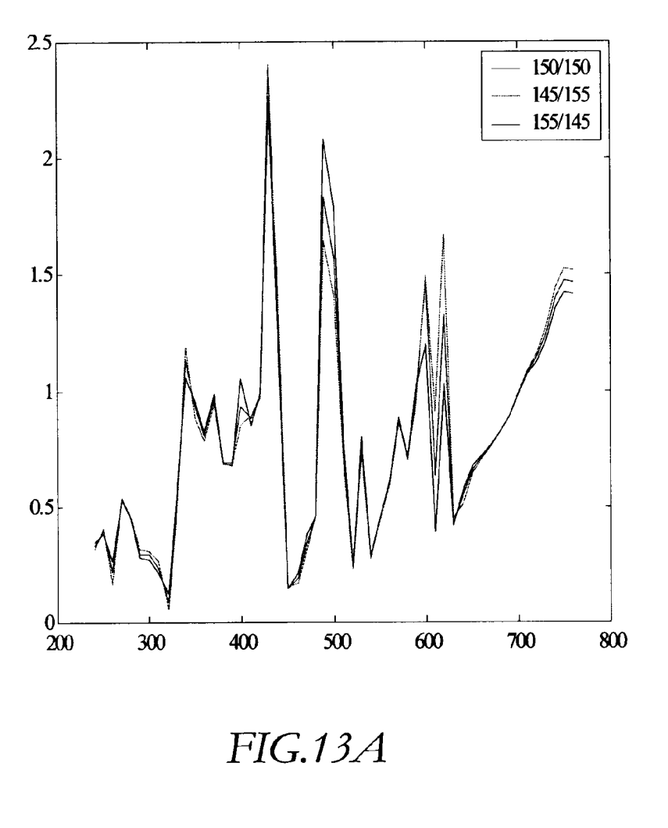
FIGS. 13A–13B are graphical diagrams illustrating the overlay measurements of the line-on-line structure in FIG. 12 using an ellipsometer in accordance with the present invention.
Figure 13B:
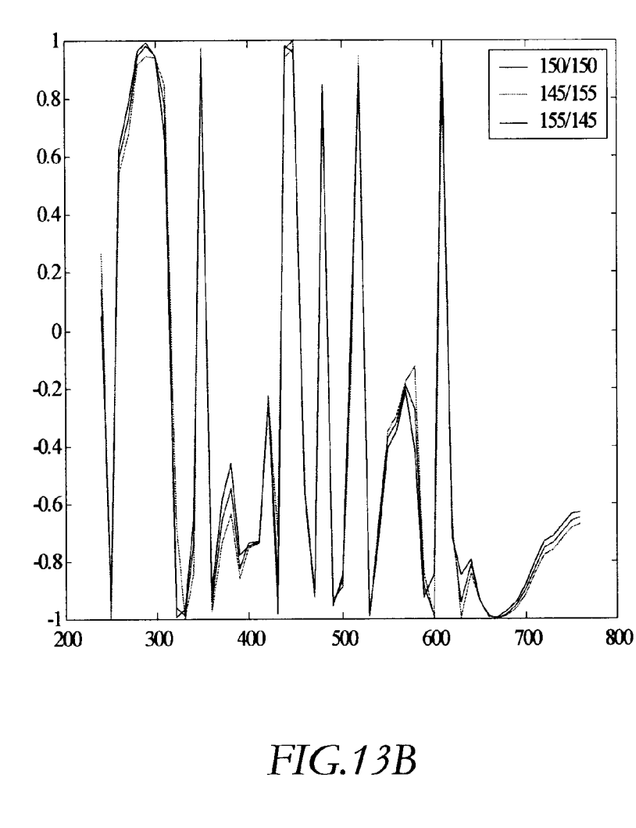

FIG. 12 is a process diagram illustrating a second example of a line-on-line structure 120, with dielectric layers 121 and 122. FIGS. 13A–13B are graphical diagrams illustrating the overlay measurements of the line-on-line structure in FIG. 12 using an ellipsometer in accordance with the present invention.

The line-in-line and line-on-line overlay measurements can be applied to single wavelength variable incident angle optical metrology equipment. Additionally, the line-in-line and line-on-line overlay measurements can be applied to any combination of single wavelength variable incident angle optical metrology equipment and multiple wavelength fixed incident angle optical metrology equipment. Furthermore, the line-in-line and line-on-line overlay measurements can be applied to multiple wavelength multiple incident angle optical metrology equipment.

The above embodiments are only illustrative of the principles of this invention and are not intended to limit the invention to the particular embodiments described. Accordingly, various modifications, adaptations, and combinations of various features of the described embodiments can be practiced without departing from the scope of the invention as set forth in the appended claims.

We claim:

1. A line-on-line structure, comprising:
   a first mask having a plurality of dark lines and a plurality of clear lines, each dark line being placed adjacent to clear lines, and
   a second mask having a plurality of dark lines and a plurality of clear lines, each dark line in the second mask being placed in the center of a dark line in the first mask.

2. The line-on-line structure of claim 1, when using a positive resist, the dark lines in the first mask being wider than the clear lines in the first mask.

3. The line-on-line structure of claim 1, when using a negative resist, the dark lines in the first mask being narrower than the clear lines in the first mask.

4. The line-on-line structure of claim 1, wherein the plurality of clear lines in the first mask are identical or substantially identical to one another, and wherein the plurality of the dark lines in the first mask are identical or substantially identical to one another, thereby the combination of clear lines and dark lines in the first mask producing a repetitive pattern on the first mask.

5. The line-on-line structure of claim 1, wherein the plurality of dark lines in the first mask being wider than the plurality of dark lines in the second mask.

6. The line-on-line structure of claim 1, wherein the plurality of clear lines in the first mask being narrower than the plurality of clear lines in the second mask.

7. The line-on-line structure of claim 1, wherein the first dark line in the plurality of dark lines in the second mask having a left edge and a right edge, and wherein a first dark line in the plurality of dark lines in the first mask having a left edge and a right edge.

8. The line-on-line structure of claim 7, further comprising:
   a $d_1$ distance measuring a gap from the left edge of the first dark line in the second mask to the left edge of the first dark line in the first mask, and
   a $d_2$ distance measuring a gap from the right edge of the first dark line in the second mask to the right edge of the first dark line in the first mask.

9. The line-on-line structure of claim 8, wherein the first dark line in the second mask is in the center of the first dark line in the first mask if $d_1=d_2$.

10. The line-on-line structure of claim 8, wherein the first dark line in the second mask shifts to the right of the first dark line in the first mask if $d_1$ minus $d_2$ produces a positive number.

11. The line-on-line structure of claim 8, wherein the first dark line in the second mask shifts to the left of the first dark line in the first mask if $d_1$ minus $d_2$ produces a negative number.

12. A line-in-line structure, comprising:
   a first mask having a plurality of dark lines and a plurality of clear lines, each dark line being placed adjacent to clear lines, and
   a second mask having a plurality of dark lines and a plurality of clear lines, each clear line in the second mask being placed in the center of a clear line in the first mask.

13. The line-in-line structure of claim 12, when using a positive resist, the plurality of clear lines in the first mask being wider than the plurality of dark lines in the first mask.

14. The line-in-line structure of claim 12, when using a negative resist, the plurality of clear lines in the first mask being narrower than the plurality of clear lines in the first mask.

15. The line-in-line structure of claim 12, wherein the plurality of clear lines in the first mask are identical or substantially identical to one another, and wherein the dark lines in the first mask are identical or substantially identical to one another, thereby the combination of clear lines and dark lines in the first mask producing a repetitive pattern on the first mask.

16. The line-in-line structure of claim 12, wherein the plurality of dark lines in the first mask being narrower that the plurality of dark lines of the second masks.

17. The line-in-line structure of claim 12, wherein the plurality of clear lines in the first mask being wider than the plurality of clear lines in the second masks.

18. The line-in-line structure of claim 12, wherein a first clear line in the plurality of clear lines in the second mask having a left edge and a right edge, and wherein a first clear line in the plurality of clear lines in the first mask having a left edge and a right edge.

19. The line-in-line structure of claim 18, further comprising:
 a $X_1$ distance measuring a gap from the left edge of the first clear line in the second mask to the left edge of the first clear line in the first mask, and
 a $X_2$ distance measuring a gap from the right edge of the first clear line in the second mask to the right edge of the first clear line in the first mask.

20. The line-in-line structure of claim 18, wherein the first clear line in the second mask is in the center of the first clear line in the first mask if $X_1=X_2$.

21. The line-in-line structure of claim 18, wherein the first clear line in the second mask is shifts to the right of the first clear line in the first mask if $X_1$ minus $X_2$ produces a positive number.

22. The line-in-line structure of claim 18, wherein the first clear line in the second mask is shifts to the right of the first clear line in the first mask if $X_1$ minus $X_2$ produces a positive number.

23. A method for multi-orientation of orthogonal pairs, comprising:
 fabricating a grating on a semiconductor wafer; and
 shining a light on the grating wherein the light is not perpendicular to the orientation of the grating.

24. The method for multi-orientation of orthogonal pairs of claim 23, wherein the orientation of the grating forms a positive slope.

25. The method for multi-orientation of orthogonal pairs of claim 23, wherein the orientation of the grating forms a negative slope.

26. A method for multi-orientation of orthogonal pairs for overlay metrology of wafer structures, the wafer structures having an X and a Y axes, the method comprising:
 fabricating a first grating at zero degrees relative to the X axis; and
 fabricating a second grating orthogonal to the first grating at ninety degrees relative to the X axis,
 wherein the first grating is adjacent to the second grating.

27. The method of claim 26, further comprising:
 fabricating a third grating at +45 degrees relative to the X axis; and
 fabricating a fourth grating at −45 degrees relative to the X axis,
 wherein the third grating is adjacent to the fourth grating and the third and fourth gratings are adjacent to the first and second gratings.

28. The method of claim 27 further comprising:
 measuring the first, second, third, and fourth gratings using an ellipsometer.

29. A method of forming a line-on-line structure, the method comprising:
 exposing a first mask having a plurality of dark lines and a plurality of clear lines, each dark line being placed adjacent to clear lines; and
 exposing a second mask having a plurality of dark lines and a plurality of clear lines, each dark line in the second mask being placed in the center of a dark line in the first mask.

30. The method of claim 29, wherein when using a positive resist, the dark lines in the first mask are wider than the clear lines in the first mask.

31. The method of claim 29, wherein when using a negative resist, the dark lines in the first mask are narrower than the clear lines in the first mask.

32. The method of claim 29, wherein the plurality of clear lines in the first mask are identical or substantially identical to one another, wherein the plurality of the dark lines in the first mask are identical or substantially identical to one another, and wherein the combination of clear lines and dark lines in the first mask produce a repetitive pattern on the first mask.

33. The method of claim 29, wherein the plurality of dark lines in the first mask are wider than the plurality of dark lines in the second mask.

34. The method of claim 29, wherein the plurality of clear lines in the first mask are narrower than the plurality of clear lines in the second mask.

35. The method of claim 29, wherein the first dark line in the plurality of dark lines in the second mask has a left edge and a right edge, and wherein a first dark line in the plurality of dark lines in the first mask has a left edge and a right edge.

36. The method of claim 35, further comprising:
 a $d_1$ distance measuring a gap from the left edge of the first dark line in the second mask to the left edge of the first dark line in the first mask, and
 a $d_2$ distance measuring a gap from the right edge of the first dark line in the second mask to the right edge of the first dark line in the first mask.

37. The method of claim 36, wherein the first dark line in the second mask is in the center of the first dark line in the first mask if $d_1=d_2$.

38. The method of claim 36, wherein the first dark line in the second mask shifts to the right of the first dark line in the first mask if $d_1$ minus $d_2$ produces a positive number.

39. The line-on-line structure of claim 36, wherein the first dark line in the second mask shifts to the left of the first dark line in the first mask $d_1$ minus $d_2$ produces a negative number.

* * * * *

UNITED STATES PATENT AND TRADEMARK OFFICE
CERTIFICATE OF CORRECTION

PATENT NO. : 6,699,624 B2
DATED : March 2, 2004
INVENTOR(S) : Xinhui Niu et al.

It is certified that error appears in the above-identified patent and that said Letters Patent is hereby corrected as shown below:

Title page,
Item [56], References Cited, U.S. PATENT DOCUMENTS, please include the following references:

| | | |
|---|---|---|
| -- 6/1/1982 | 4,332,473 | Ono |
| 5/29/1990 | 4,929,083 | Brunner |
| 9/30/1997 | 5,672,520 | Natsume |
| 9/13/1994 | 5,347,356 | Ota et al. |
| 8/13/1996 | 5,545,593 | Watkins et al. |
| 6/27/2000 | 6,079,256 | Bareket -- |

FOREIGN PATENT DOCUMENTS, please include the following references:

| | | |
|---|---|---|
| -- 9/7/1988 | 0 281 030 A2 | EPO |
| 4/17/1991 | 0 422 395 A2 | EPO -- |

Column 4,
Line 30, please replace "...43b in the second mask to the left edge of the first clear line .." with -- ...43b in the second mask to the left edge of the second clear line... --
Line 33, please replace "... second mask to the right edge of the first clear line..." with -- ...second mask to the right edge of the second clear line... --

Column 6,
Line 65-67, please replace "The line-in-line structure of Claim 12, wherein the plurality of dark lines in the first mask being narrower than the plurality of dark lines of the second masks" with -- The line-in-line structure of Claim 12, wherein the plurality of dark lines in the first mask being narrower than the plurality of dark lines of the second masks --

UNITED STATES PATENT AND TRADEMARK OFFICE
CERTIFICATE OF CORRECTION

PATENT NO. : 6,699,624 B2
DATED : March 2, 2004
INVENTOR(S) : Xinhui Niu et al.

It is certified that error appears in the above-identified patent and that said Letters Patent is hereby corrected as shown below:

<u>Column 7,</u>
Line 13, please replace "...first clear line in the first mask." with -- ...second clear line in the first mask .. --
Line 16, please replace "...first clear in the first mask." with -- ...second clear line in the first mask... --
Line 25, please replace "... clear line in the second mask is shifts to the right of the first..." with -- ... clear line in the second mask shifts to the left of the first... --

Signed and Sealed this

Twenty-seventh Day of July, 2004

JON W. DUDAS
*Acting Director of the United States Patent and Trademark Office*